(12) United States Patent
Baek et al.

(10) Patent No.: US 11,129,288 B2
(45) Date of Patent: Sep. 21, 2021

(54) PACKING MATERIALS FOR DISPLAY APPARATUS AND PACKING METHOD FOR DISPLAY APPARATUS

(71) Applicant: SAMSUNG ELECTRONICS CO., LTD., Suwon-si (KR)

(72) Inventors: Seok Bong Baek, Hwaseong-si (KR); Ho Yeon Kim, Suwon-si (KR); Bong Sup Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 415 days.

(21) Appl. No.: 15/822,332

(22) Filed: Nov. 27, 2017

(65) Prior Publication Data
US 2018/0153050 A1 May 31, 2018

(30) Foreign Application Priority Data
Nov. 25, 2016 (KR) .......................... 10-2016-0157942

(51) Int. Cl.
*H05K 5/03* (2006.01)
*B65D 81/03* (2006.01)
(Continued)

(52) U.S. Cl.
CPC ................. *H05K 5/03* (2013.01); *B32B 3/06* (2013.01); *B65D 65/14* (2013.01); *B65D 81/03* (2013.01);
(Continued)

(58) Field of Classification Search
CPC ........ H05K 5/03; H05K 5/0017; B65D 65/14; B65D 81/03; B65D 85/38; B65D 81/107;
(Continued)

(56) References Cited

U.S. PATENT DOCUMENTS 2,979,246 A * 4/1961 Liebeskind ............ B65D 5/509
206/523
3,283,988 A * 11/1966 Hardigg ............... B65D 81/107
206/521
(Continued)

FOREIGN PATENT DOCUMENTS

CN 2519785 Y 11/2002
CN 101454215 A 6/2009
(Continued)

OTHER PUBLICATIONS

Communication dated Aug. 2, 2019, issued by the European Patent Office in counterpart European Application No. 17 87 2944.
(Continued)

*Primary Examiner* — Chun Hoi Cheung
(74) *Attorney, Agent, or Firm* — Sughrue Mion, PLLC

(57) ABSTRACT

Disclosed herein is a display apparatus packing material. The display apparatus packing material includes a first area configured to cover a front surface of a display apparatus; a second area configured to cover sides of the display apparatus, and extending from edges of the first area; and a third area disposed between the first area and the second area such that the second area is bendable with respect to the first area, wherein the second area covers sides of the display apparatus when the second area is bent, and includes an adhesive member configured to be attached on the sides of the display apparatus.

10 Claims, 11 Drawing Sheets

(51) Int. Cl.
  *B65D 85/38* (2006.01)
  *B65D 65/14* (2006.01)
  *B32B 3/06* (2006.01)
  *H05K 5/00* (2006.01)
  *B65D 81/107* (2006.01)

(52) U.S. Cl.
  CPC .......... *B65D 85/38* (2013.01); *H05K 5/0017* (2013.01); *B32B 2457/20* (2013.01); *B32B 2553/00* (2013.01); *B65D 81/107* (2013.01); *B65D 2585/6837* (2013.01)

(58) Field of Classification Search
  CPC ........ B65D 2585/6837; B32B 2457/20; B32B 2553/00; B32B 3/06
  USPC ................ 206/523, 453, 591, 592, 594, 320
  See application file for complete search history.

(56) References Cited

U.S. PATENT DOCUMENTS

| | | | | |
|---|---|---|---|---|
| 3,580,469 A * | 5/1971 | Reese | ................... | B65D 81/056 206/521 |
| 4,709,817 A * | 12/1987 | Keady | ................... | B65D 81/107 206/521 |
| 4,762,226 A * | 8/1988 | Gatton | ..................... | B65D 5/12 206/320 |
| 4,953,705 A * | 9/1990 | Evamy | ................... | B65D 5/509 206/523 |
| 5,680,934 A * | 10/1997 | Jaegers | ................... | B65D 65/44 206/586 |
| 5,938,068 A * | 8/1999 | Atkins | ................... | B65D 75/22 220/266 |
| 6,092,651 A * | 7/2000 | Miller | ................... | B65D 81/113 206/305 |
| 6,347,703 B1 | 2/2002 | Betts | | |
| 6,969,548 B1 * | 11/2005 | Goldfine | ............. | B29C 44/1214 428/159 |
| 7,832,558 B2 * | 11/2010 | Cheng | ................... | B65D 5/5069 206/320 |
| 8,623,489 B2 * | 1/2014 | Depaoli | ................... | B26D 7/27 108/51.3 |
| 2003/0057131 A1 | 3/2003 | Diaferia | | |
| 2003/0134070 A1 | 7/2003 | Klein | | |
| 2007/0215501 A1 | 9/2007 | Hanson et al. | | |
| 2016/0068332 A1 | 3/2016 | Flynn et al. | | |
| 2016/0261652 A1 | 9/2016 | Lee et al. | | |

FOREIGN PATENT DOCUMENTS

| | | |
|---|---|---|
| CN | 109996741 A | 7/2019 |
| DE | 201 07 339 U1 | 10/2001 |
| DE | 20 2010 013 518 U1 | 12/2010 |
| EP | 0 796 797 A3 | 5/1998 |
| JP | 201235864 A | 2/2012 |
| KR | 102002009579 A | 12/2002 |
| KR | 200371623 Y1 | 1/2005 |
| KR | 20-0376334 Y1 | 3/2005 |
| KR | 10-2007-0115211 A | 12/2007 |
| KR | 1020080007909 A | 1/2008 |
| KR | 20-2011-0002499 U | 3/2011 |
| KR | 20-2014-0003413 U | 6/2014 |
| WO | 97/32797 A1 | 9/1997 |

OTHER PUBLICATIONS

International Search Report dated Mar. 9, 2018, issued by the International Searching Authority in counterpart International Application No. PCT/KR2017/013158 (PCT/ISA/210).
Communication dated Apr. 9, 2020 issued by the State Intellectual Property Office of P.R. China in counterpart Chinese Application No. 201780073025.6.
Communication dated Jan. 28, 2020, issued by the European Patent Office in counterpart European Application No. 17872944.8.
Office Action dated May 28, 2020 by the Korean Intellectual Property Office in counterpart Korean Patent Application No. 10-2016-0157942.

* cited by examiner

PACKING MATERIALS FOR DISPLAY APPARATUS AND PACKING METHOD FOR DISPLAY APPARATUS

CROSS-REFERENCE TO RELATED APPLICATION

This application claims benefit from Korean Patent Application No. 10-2016-0157942, filed on Nov. 25, 2016 in the Korean Intellectual Property Office, the disclosure of which is incorporated herein by reference in its entirety.

BACKGROUND

1. Field

Apparatuses and methods consistent with exemplary embodiments relate to a packing material for a display apparatus, and a packing method of the display apparatus having an improved process.

2. Description of the Related Art

A display apparatus is an apparatus to display images through a self-luminescence display panel such as an Organic Light-Emitting Diode (OLED) panel, or a light receiving display panel such as a Liquid Crystal Display (LCD) panel.

In general, a display apparatus is, after it is manufactured, stored and transported in a packed state. Particularly, a display apparatus packing material includes a protective sheet for protecting the front surface of a display panel and a buffer member disposed in the sides of the display apparatus to reduce impact strength due to an external impact, in order to prevent the display panel from being damaged such as being scratched during transport.

SUMMARY

Therefore, it is an aspect of the present disclosure to provide a display packing material for simplifying a packing process of a display apparatus.

Additional aspects of the disclosure will be set forth in part in the description which follows and, in part, will be obvious from the description, or may be learned by practice of the disclosure.

According to an aspect of an exemplary embodiment, there is provided a display apparatus packing material including: a first area configured to cover a front surface of a display apparatus; a second area configured to cover sides of the display apparatus, and extending from edges of the first area; and a third area disposed between the first area and the second area such that the second area is bendable with respect to the first area, wherein the second area covers sides of the display apparatus when the second area is bent, and includes an adhesive member configured to be attached on the sides of the display apparatus.

The second area may include a buffer member configured to protect the sides of the display apparatus.

The first area may include a protective sheet configured to protect the front surface of the display apparatus.

The first area may further include an auxiliary buffer member configured to protect the front surface of the display apparatus.

The protective sheet may extend to the second area, and the buffer member may be attached on the protective sheet.

The auxiliary buffer member and the buffer member may have a same thickness.

The third area may include a guide line formed with a plurality of grooves arranged at intervals, and the third area is bendable along the guide line.

The protective sheet may include a front portion located in the first area and covering the front surface of the display apparatus, and a wing portion located in the second area and extending from four edges of the front portion to cover the sides of the display apparatus.

The protective sheet may include a guide line forming a border between the front portion and the wing portion with a plurality of guide grooves.

The adhesive member may be disposed on one surface of the wing portion of the protective sheet such that the adhesive member is attached on the sides of the display apparatus when the wing portion is bent with respect to the front portion.

The buffer member may be disposed on an opposite surface of the wing portion.

The front portion may have a shape of a rectangle, and the wing portion may include four wings extending from four edges of the front portion, and the four wings do not contact each other.

The buffer member may include ethylene-vinyl acetate copolymer (EVA).

The protective sheet may include Polyethylene phthalate (PET).

The auxiliary buffer member may include expanded polyethylene (EPE).

According to another aspect of an exemplary embodiment, there is provided a display apparatus packing material including: a protective sheet including a front portion formed in a shape of a rectangle to cover a front surface of a display apparatus, and four wing portions extending from four edges of the front portion; four adhesive members disposed on one surface of the four wing portions such that the four wing portions are fixed on sides of the display apparatus; and four buffer members disposed on an opposite surface of the four wing portions to protect the sides of the display apparatus, wherein the four wing portions are bent with respect to the front portion to cover the sides of the display apparatus.

The four wing portions may include a first wing portion covering one side of the display apparatus, a second wing portion covering another side of the display apparatus that is adjacent to the one side of the display apparatus, and a slit may be formed between one end of the first wing portion and one end of the second wing portion adjacent to the first wing portion.

The protective sheet may include a guide line forming a border between the front portion and the four wing portions, and guiding the four wing portions to be respectively bent with respect to the front portion.

The front portion further may include an auxiliary buffer member configured to protect the front portion of the display apparatus, and the protective sheet, the buffer members, and the auxiliary buffer member may include different materials.

According to yet another aspect of an exemplary embodiment, there is provided a method of packing a display apparatus, including: putting a display apparatus packing material including a first area covering a front surface of the display apparatus, and a second area extending from edges of the first area, on the front surface of the display apparatus; removing a protective film of an adhesive member disposed on the second area; bending the second area on a guide line configured to guide the second area to be bent with respect to the first area; and pressing the second area onto sides of the display apparatus so that a buffer member disposed on the second area covers the sides of the display apparatus.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION OF EXEMPLARY EMBODIMENTS

Figure 1:
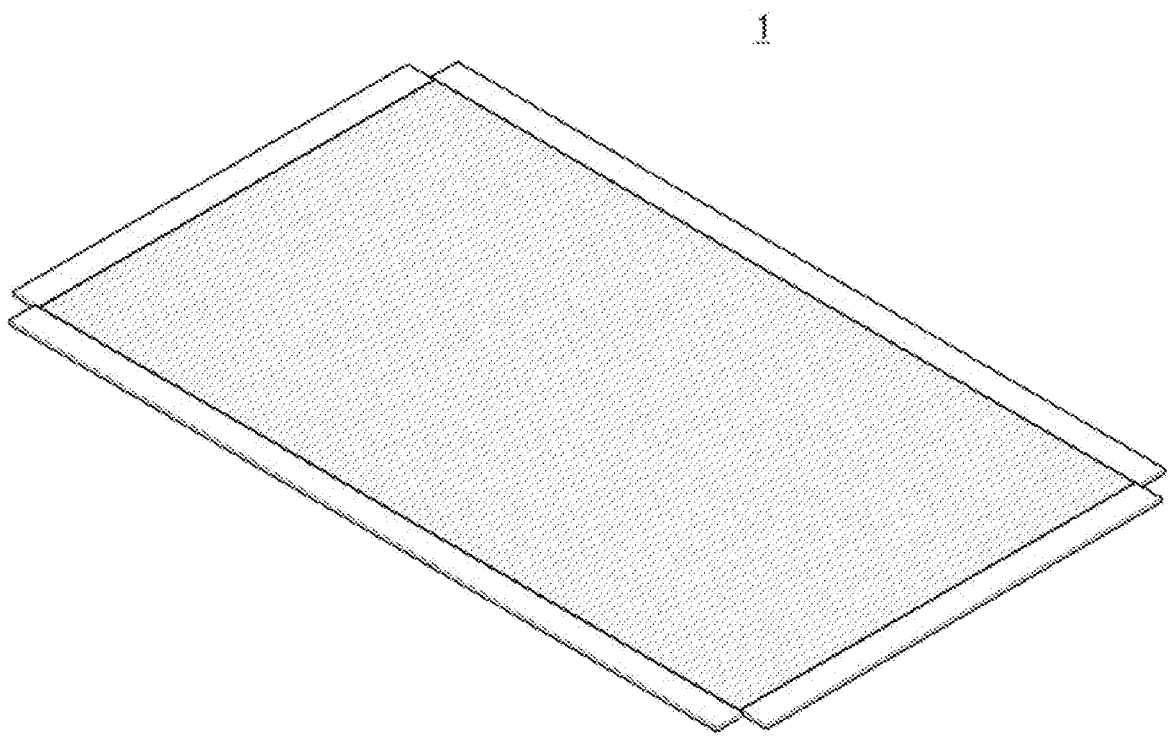
FIG. 1 is a perspective view of a display apparatus packaging material according to an exemplary embodiment.

Configurations illustrated in the drawings and the specification are only exemplary embodiments, and thus it is to be understood that various modified examples may replace the exemplary embodiments.

Also, like reference numerals or symbols denoted in the drawings of the present specification represent members or components that perform the substantially same functions.

The terms used in the present specification are used to describe the exemplary embodiments of the present disclosure. Accordingly, it should be apparent to those skilled in the art that the following description of exemplary embodiments is provided for illustration purpose only and not for the purpose of limiting the inventive concept as defined by the appended claims and their equivalents. It is to be understood that the singular forms "a," "an," and "the" include plural referents unless the context clearly dictates otherwise. It will be understood that when the terms "includes," "comprises," "including," and/or "comprising," when used in this specification, specify the presence of stated features, figures, steps, components, or combination thereof, but do not preclude the presence or addition of one or more other features, figures, steps, components, members, or combinations thereof.

It will be understood that, although the terms first, second, etc. may be used herein to describe various components, these components should not be limited by these terms. These terms are only used to distinguish one component from another. For example, a first component could be termed a second component, and, similarly, a second component could be termed a first component, without departing from the scope of the present disclosure. As used herein, the term "and/or" includes any and all combinations of one or more of associated listed items.

Hereinafter, the exemplary embodiments will be described in detail with reference to the accompanying drawings.

The following description relates to an example of packing a flat panel display apparatus, however, the description may be applied to a curved display apparatus or a bendable or flexible display apparatus that can change its state between a flat state and a curved state.

Also, the present disclosure can be applied to all kinds of display apparatuses regardless of their screen sizes. For example, the present disclosure can be applied to a product, such as a smart television, a monitor, and the like, which can be installed on a table, a wall, a ceiling, etc., or to a portable product, such as a tablet Personal Computer (PC), a laptop computer, a smart phone, e-book, and the like.

Figure 5:
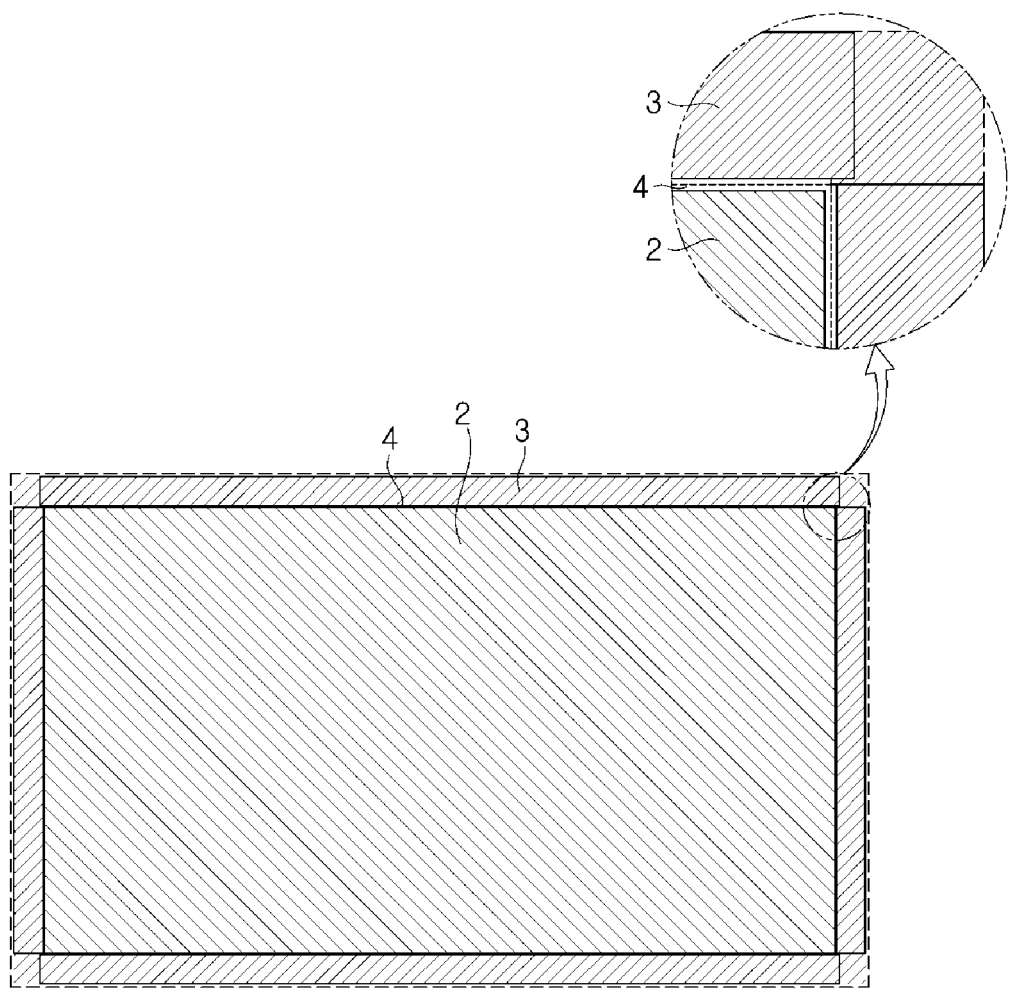
FIG. 5 is a view illustrating an area of a display apparatus package according to an exemplary embodiment.

Also, in the present specification, a "front direction" and a "front surface" are defined based on the front surface of a display panel displaying a screen in a display apparatus shown in FIG. 5. That is, a surface of a display apparatus packing material contacting the display panel is a rear surface, and the opposite surface of the rear surface is a front surface. An "upper portion" and a "lower portion" respectively represent an upper portion and a lower portion of the display apparatus packing material shown in FIG. 1 based on the rear and front surfaces, and "both sides" and "side directions" represent left and right directions of the display apparatus packing material shown in FIG. 1.

Figure 2:
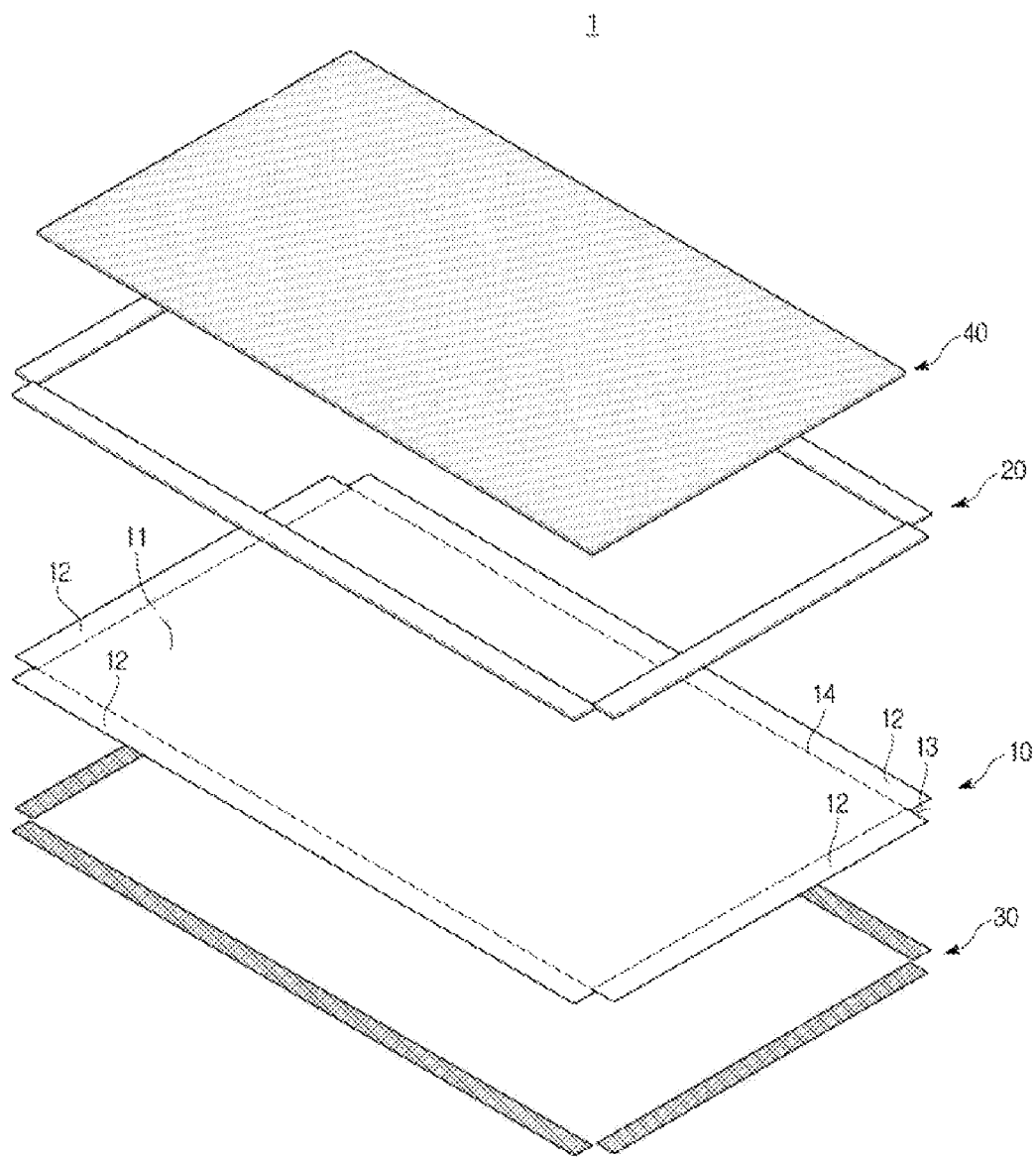
FIG. 2 is an exploded perspective view of a display apparatus packaging material according to an exemplary embodiment.
Figure 3:
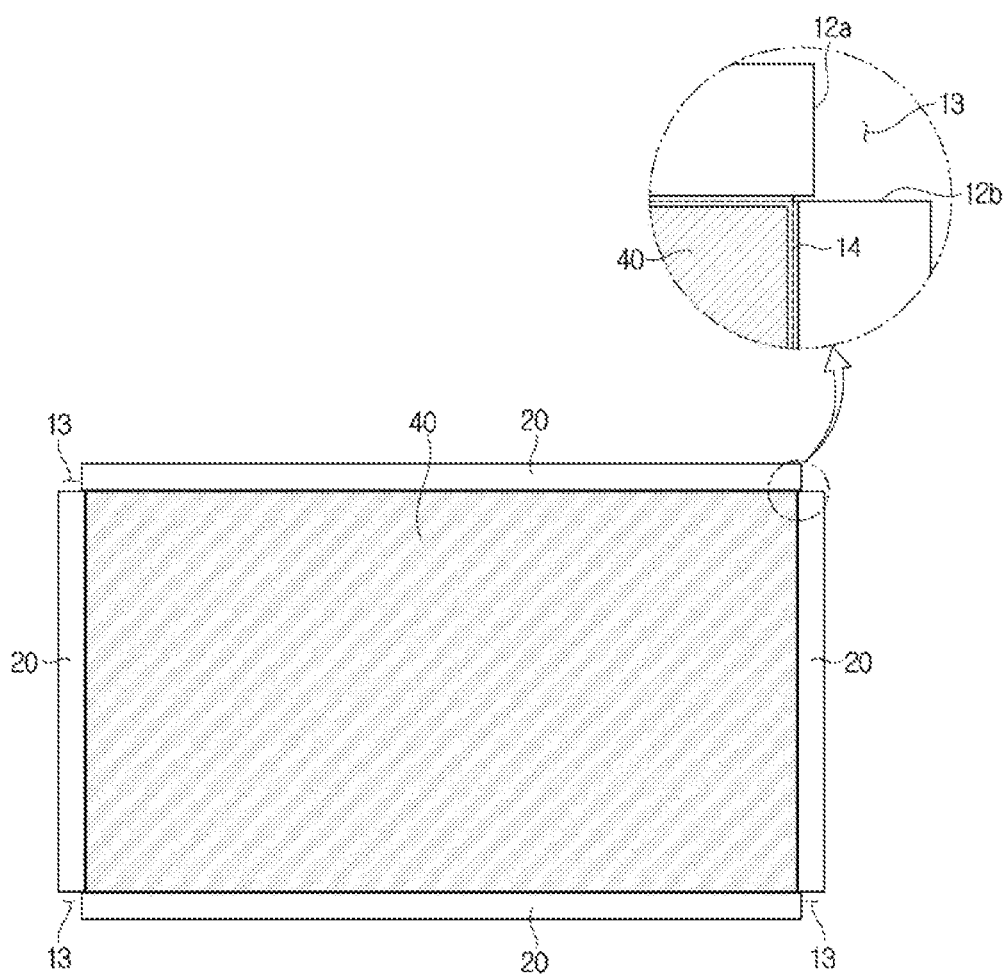
FIG. 3 is a front view of a display apparatus packaging material according to an exemplary embodiment.
Figure 4:
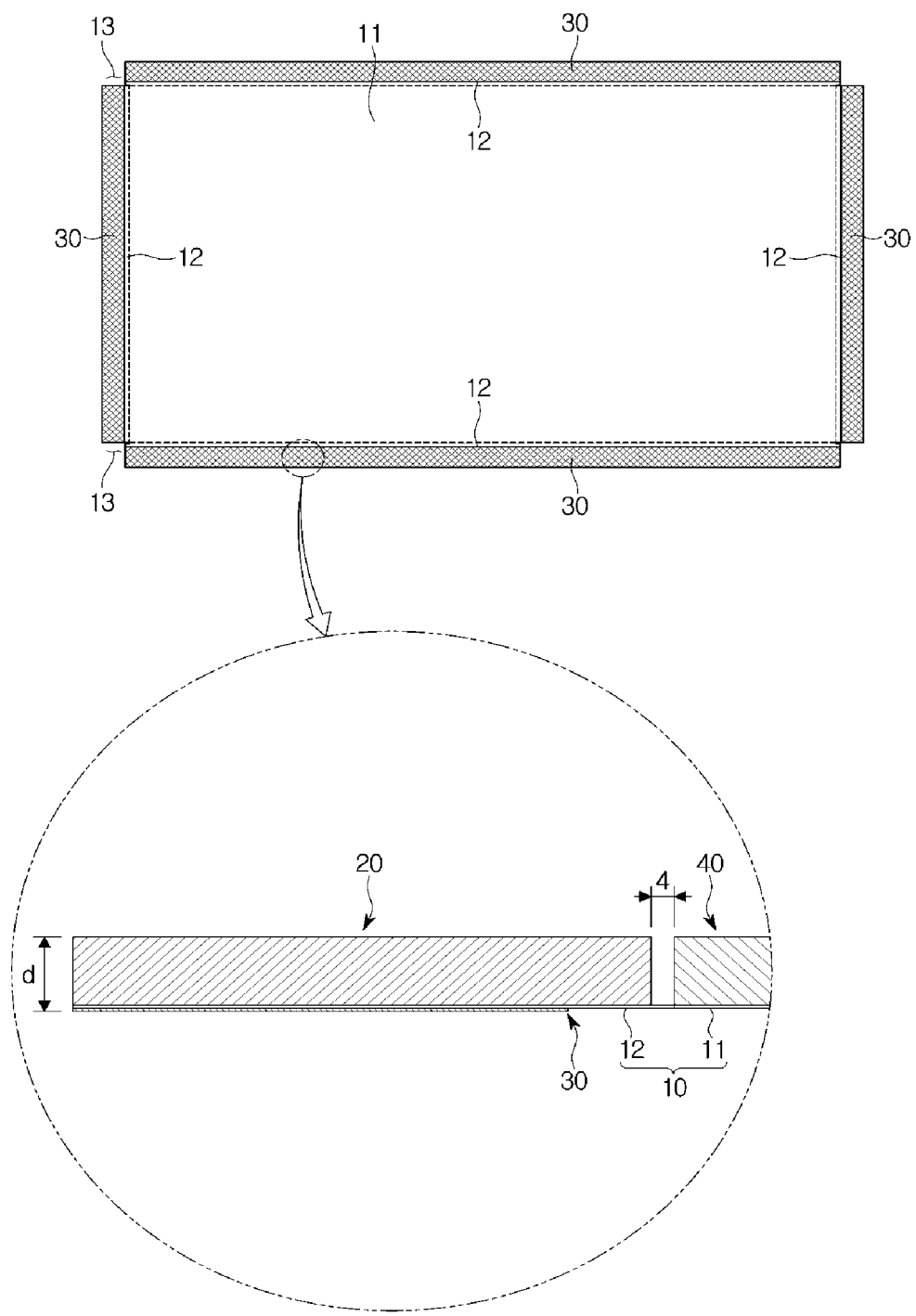
FIG. 4 is a rear view of a display apparatus packaging material according to an exemplary embodiment.

FIG. 1 is a perspective view of a display apparatus packing material according to an exemplary embodiment, FIG. 2 is an exploded perspective view of the display apparatus packing material according to the exemplary embodiment, FIG. 3 is a front view of the display apparatus packing material according to the exemplary embodiment, FIG. 4 is a rear view of the display apparatus packing material according to the exemplary embodiment, and FIG. 5 shows an area of the display apparatus packing material according to the exemplary embodiment.

In the case of using typical display apparatus packing materials, a display apparatus is firstly packed through separation prevention taping for fixing a bezel and a display panel, in order to prevent the display panel from being separated from the bezel due to an impact during transport. That is, the display panel is taped together with the bezel at the areas adjacent to the bezel so that the display panel is fixed at the bezel.

Thereafter, the display apparatus is secondarily packed with a protective sheet to cover the display panel, in order to prevent the display panel from being damaged by an impact during transport. That is, the display apparatus is packed by a method of covering the front surface of the display panel with the protective sheet, and attaching the edges of the protective sheet on the display apparatus.

Then, the display apparatus is thirdly packed by disposing buffer members along the sides of the display apparatus, in order to protect the main body of the display apparatus from an impact during transport. That is, the buffer members are put around the sides of the display apparatus and then fixed in order to cushion an external impact.

As such, typically, three or more display apparatus packing materials are used to pack a display apparatus through three processes or more. Therefore, such a large number of processes for packing a display apparatus result in inefficiency. In order to overcome the problem, according to the exemplary embodiments, a single display apparatus packing material, instead of three separate display apparatus packing materials, may be used to pack a display apparatus, while preventing a display panel from being separated from a bezel and protecting the display panel and the main body of the display apparatus.

As shown in FIGS. 1 to 5, a display apparatus packing material 1 according to an exemplary embodiment may include a protective sheet 10, a buffer member 20, an adhesive member 30, and an auxiliary buffer member 40. The display apparatus packing material 1 may include a plurality of components to simplify a process of packing a display apparatus, while obtaining the same effect as in a typical process of packing a display apparatus many times.

More specifically, the protective sheet 10 may cover the front surface of the display panel, and prevent the display panel from being separated from the bezel. Accordingly, the protective sheet 10 may be larger than a cross-section area of the front surface of the display apparatus (see FIG. 6).

That is, the protective sheet 10 may include a front portion 11 formed in the shape of a rectangle corresponding to a size of the display panel to protect the display panel, and a wing portion 12 extending from the four edges of the front portion 11 and fixed on the sides of the display apparatus to prevent the display panel from being separated from the bezel.

The protective sheet 10 may be formed of a synthetic resin. The protective sheet 10 may include polyethylene phthalate (PET). Also, the protective sheet 10 may include nylon, low-density polyethylene (LDPE), etc.

The protective sheet 10 may maintain predetermined durability, and have transparency to enable users to view the display apparatus packed therein. Also, the protective sheet 10 may have a thickness of preferably about 0.01 mm.

The wing portion 12 may extend from the four edges of the front portion 11, as described above. Accordingly, the wing portion 12 may be configured with four wings extending in upper, lower, left, and right directions. The wing portion 12 may be bent to cover the sides of the display apparatus when the display apparatus is packed.

The wing portion 12 may be in the shape of four rectangles extending from the edges of the front portion 11. When the wing portion 12 is bent, one end 12a of each rectangular wing may not contact one end 12b of another rectangular wing adjacent to the rectangular wing so that the four rectangles can be bent without any interruption.

Accordingly, the ends 12a and 12b of the adjacent ones of the four wings may be disposed on the sides of the display apparatus without contacting each other, even when the wing portion 12 is bent vertically to the front portion 11.

In other words, slits 13 may be formed between the ends of the four rectangles of the wing portion 12 so that the four rectangles can be bent without any interruption.

The four rectangles of the wing portion 12 may respectively correspond to the sides of the display apparatus. Accordingly, the wing portion 12 may be fixed to support the front portion 11, and simultaneously cover the sides of the display apparatus to protect the sides of the display apparatus.

The protective sheet 10 may include a guide line 14 located between the front portion 11 and the wing portion 12, and configured to divide the front portion 11 from the wing portion 12 and to guide the wing portion 12 to be bent.

The guide line 14 may be formed along the edges of the front portion 11, and may be in the form of a plurality of grooves arranged at intervals. A user can easily bend the wing portion 12 along the guide line 14 by the plurality of grooves.

Accordingly, the protective sheet 10 may include the front portion 11 maintained as a flat surface in the inside of the guide line 14, and the wing portion 12 that is bendable vertically to the front portion 11 in the outside of the guide line 14.

The guide line 14 may reduce the thickness of the protective sheet 10 on the guide line 14 by the plurality of grooves so that the protective sheet 10 can be easily bent, according to an exemplary embodiment. Alternatively, the guide line 14 may guide the wing portion 12 to be bent by a long groove, instead of a plurality of grooves.

The adhesive member 30 may be disposed on a rear surface of the wing portion 12 in order to attach the bent wing portion 12 on the sides of the display apparatus. The adhesive member 30 may be in the form of a double-sided tape attached on the rear surface of the wing portion 12.

The adhesive member 30 may be spaced a predetermined distance from the guide line 14, without contacting the guide line 14. If the wing portion 12 is bent, the adhesive member 30 may be disposed on the sides of the display apparatus with respect to the guide line 14, together with the wing portion 12. If the adhesive member 30 contacts the guide line 14, the adhesive member 30 may extend to the front surface of the display apparatus, as well as the sides of the display apparatus.

The wing portion 12 may be bent and then adhered on the sides of the display apparatus by the adhesive member 30, and the protective sheet 10 may be fixed on the display apparatus. Accordingly, the protective sheet 10 can fix all of the front surface and sides of the display apparatus through one configuration.

The protective sheet 10 may protect the display panel disposed on the front surface of the display apparatus through the front portion 11. Also, the wing portion 12 extending from the front portion 11 may be fixed on the sides of the display apparatus by the adhesive member 30 to successively cover and protect the front surface and sides of the display apparatus 100, thereby preventing the display panel from being separated from the bezel by an impact during transport.

One surface of the adhesive member 30 may be adhered on the rear surface of the wing portion 12, and the other surface of the adhesive member 30 may be covered with a protective film 31 to protect an adhesive surface. The protective film 31 may be removed by a user who packs the display apparatus, and the user may make the adhesive surface contact the sides of the display apparatus 100 to fix the wing portion 12 on the sides of the display apparatus.

That is, if the user finally removes the protective film 31, the adhesive member 30 may have adhesive strength by which it can be easily attached/detached on/from the sides of the display apparatus 100. For example, the adhesive member 30 may have adhesive strength of about 100 gram/inch, preferably, 90 gram/inch to 110 gram/inch.

Since the adhesive member 30 can have adhesive strength selectively according to attachment/detachment of the protective film 31, the user can easily pack the display apparatus with the display apparatus packing material 1.

Also, the display apparatus packing material 1 capable of covering all of the front surface and sides of the display apparatus can be easily fixed on the sides of the display apparatus by the adhesive member 30 to protect the front surface and sides of the display apparatus, as described above. Also, the display apparatus packing material 1 may extend from the front surface of the display apparatus to the sides of the display apparatus to protect the front surface and sides of the display apparatus, while preventing the display panel from being separated from the bezel.

On the front surface of the wing portion 12, a buffer member 20 may be disposed to protect the sides of the display apparatus when the display apparatus is packed. More specifically, the wing portion 12 may be formed in the shape of four rectangles, and the buffer member 20 may be disposed on the front surfaces of the four rectangles.

The buffer member 20 may be attached on the front surface of the wing portion 12 by an adhesive or a tape.

The buffer member 20 may be bent together with the wing portion 12, and disposed at the outermost areas of the sides of the display apparatus when the display apparatus is packed. Accordingly, if the display apparatus is packed with the display apparatus packing material 1, the sides of the display apparatus can be protected by the buffer member 20 when an impact is applied to the sides of the display apparatus.

A size of the buffer member 20 may substantially correspond to that of the wing portion 12. Also, the buffer member 20 may be spaced a predetermined distance from the guide line 14. If the buffer member 20 extends to the guide line 14, the buffer member 20 may limit bending of the wing portion 12 when the wing portion 12 is bent.

The buffer member 20 may be preferably formed of ethylene-vinyl acetate copolymer (EVA). For example, the buffer member 20 may preferably have a thickness of about 5 mm. However, the buffer member 20 may be formed of other material and/or with have a different thickness.

The auxiliary buffer member 40 may be disposed on the front surface of the front portion 11. The auxiliary buffer member 40 may absorb an impact applied to the front surface of the display apparatus to protect the front surface of the display apparatus.

For example, the auxiliary buffer member 40 may be formed of expanded polyethylene (EPE). In an exemplary embodiment, the auxiliary buffer member 40 may be formed of a material having weaker buffering power than the buffer member 20. This is because there is higher probability that an impact will be applied to the sides of the display apparatus rather than to the front surface of the display apparatus when the display apparatus packed with the display apparatus packing material 1 is transported. However, the auxiliary buffer member 40 and the buffer member 20 may be formed of the same material.

The protective sheet 10, the buffer member 20, and the auxiliary buffer member 40 may be formed of different materials.

The auxiliary buffer member 40 and the buffer member 20 may be formed with the same thickness d. This is because a plurality of display apparatus packing materials can be efficiently loaded and transported when they are loaded in parallel to each other.

If no auxiliary buffer member 40 is provided or the thickness of the auxiliary buffer member 40 is different from that of the buffer member 20, the plurality of display apparatus packing materials cannot be loaded in parallel to each other, resulting in low efficiency in the loading and transporting of the display apparatus packing materials.

In other words, as shown in FIG. 5, the display apparatus packing material 1 may include a first area 2 covering the front surface of the display apparatus, a second area 3 bent from the first area 2 and covering the sides of the display apparatus, and a third area 4 disposed between the first area 2 and the second area 3 and guiding bending of the second area 3.

The first area 2, which corresponds to the front surface of the display apparatus, may include the front portion 11 of the protective sheet 10, and the auxiliary buffer member 40 disposed on the front surface of the front portion 11. The first area 2 may include no area disposed in parallel to the front surface of the display apparatus to be bent.

The second area 3, which is bent to the sides of the display apparatus and covers the sides of the display apparatus, may include a part of the wing portion 12 of the protective sheet 10, the slits 13 located at the ends of the four rectangles of the wing portion 12, the buffer member 20, and the adhesive member 30.

That is, the second area 3 may be disposed outside the first area 2, and when the display apparatus is packed with the display apparatus packing material 1, the second area 3 may be an area bent to the sides of the display apparatus.

The third area 4 may be disposed between the first area 2 and the second area 3, and divide the first area 2 and the second area 3. The third area 4 may include the guide line 14, and may also include a predetermined area around the guide line 14.

The third area 4 may be an area folded by the guide line 14 when the display apparatus is packed, and may be located along the edges of the front surface of the display apparatus.

Figure 6:
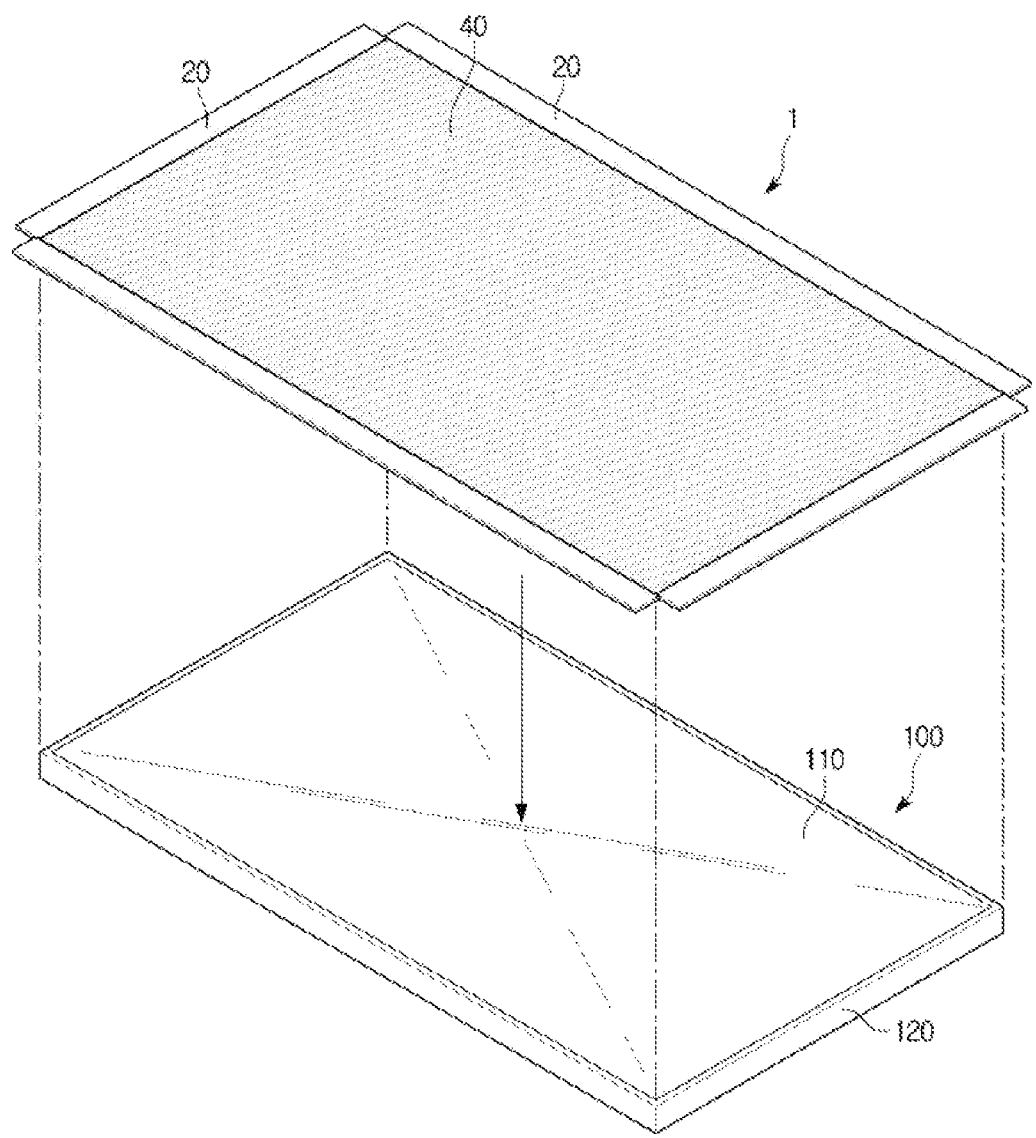
FIGS. 6 to 8 are views sequentially showing procedures of packaging a display apparatus according to an exemplary embodiment.
Figure 7:
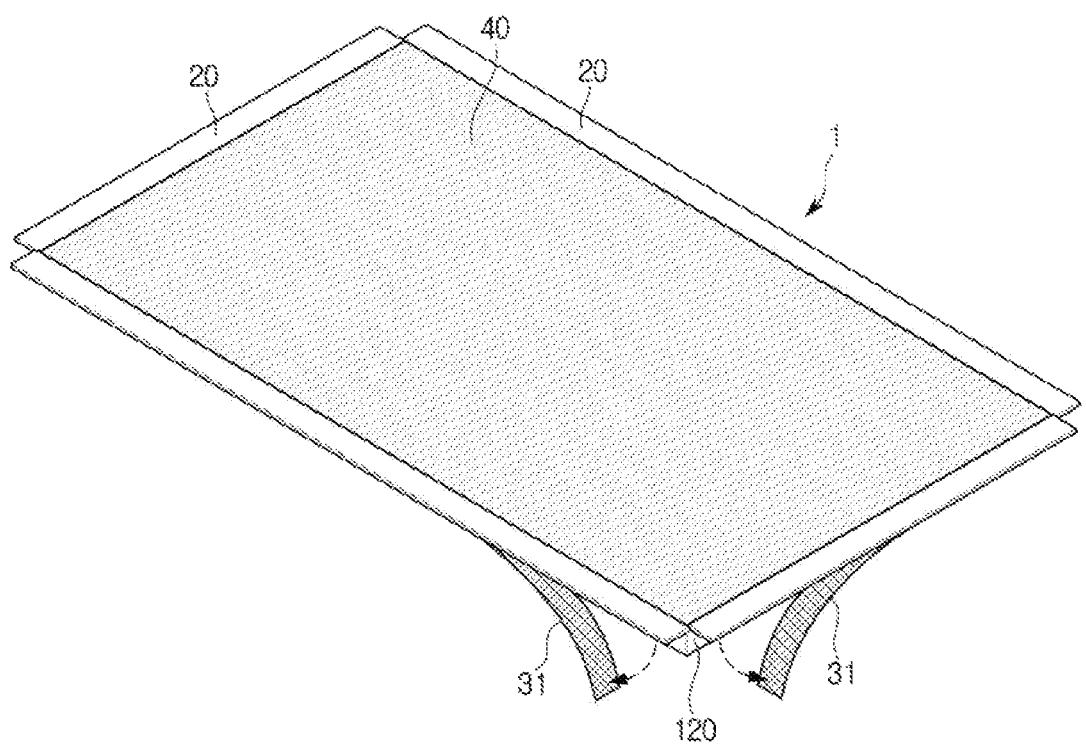
Figure 8:
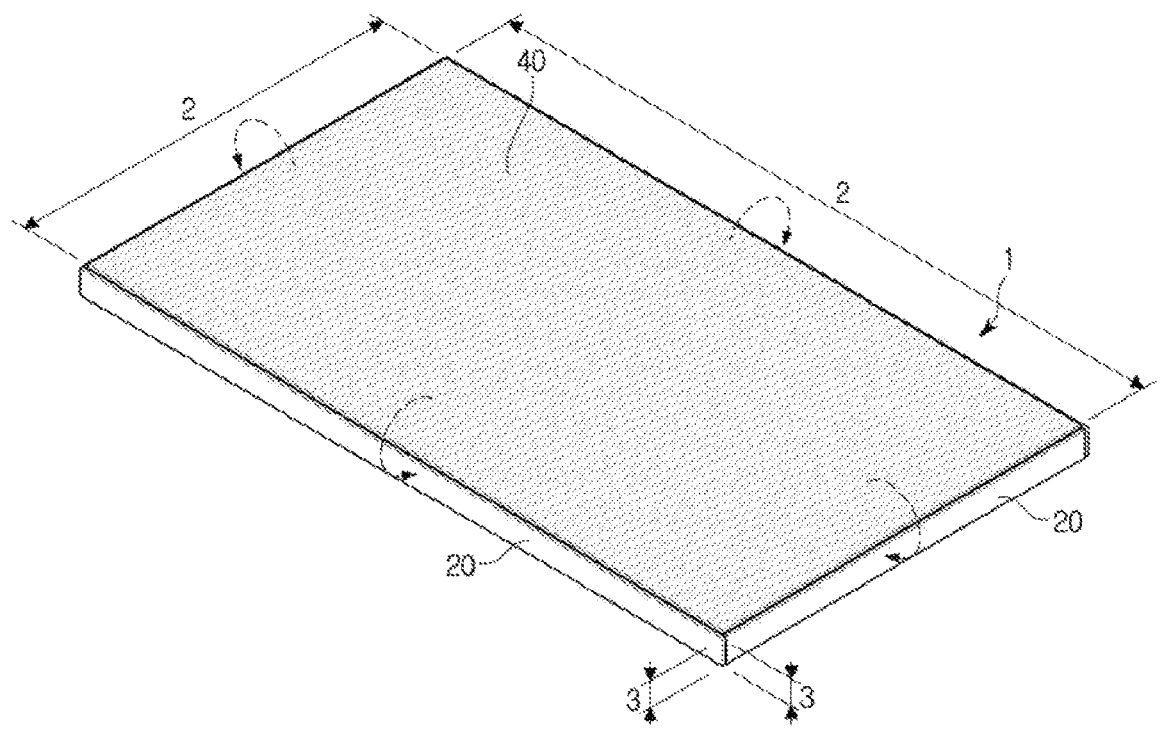

Hereinafter, a method of packing the display apparatus with the display apparatus packing material 1 will be described. FIGS. 6 to 8 are views sequentially showing operations of packing a display apparatus with a display apparatus packing material according to an exemplary embodiment.

As shown in FIG. 6, the display apparatus packing material 1 may be put on the front surface of a display apparatus 100 on which a display panel 110 is mounted, such that the front portion 11 corresponds to the display panel 110, in order to pack the display apparatus 100.

Then, as shown in FIG. 7, after the display apparatus packing material 1 is put on the front surface of the display panel 110, the protective film 31 of the adhesive member 30 attached on the rear surface of the wing portion 12 may be removed.

However, the adhesive member 30 may be maintained in an adhesive state through another member other than the protective film 31.

Then, as shown in FIG. 8, the wing portion 12 of the protective sheet 10 may be pressed onto the sides 120 of the display apparatus 100 and fixed on the sides 120 of the display apparatus 100. If the adhesive member 30 is adhered on the sides 120 of the display apparatus 100, the display apparatus packing material 1 can be fixed.

Accordingly, the first area 2 may be disposed on the front surface of the display apparatus 100 to cover the display panel 110, and the second area 3 may be bent to be disposed on the sides of the display apparatus 100.

Figure 9:
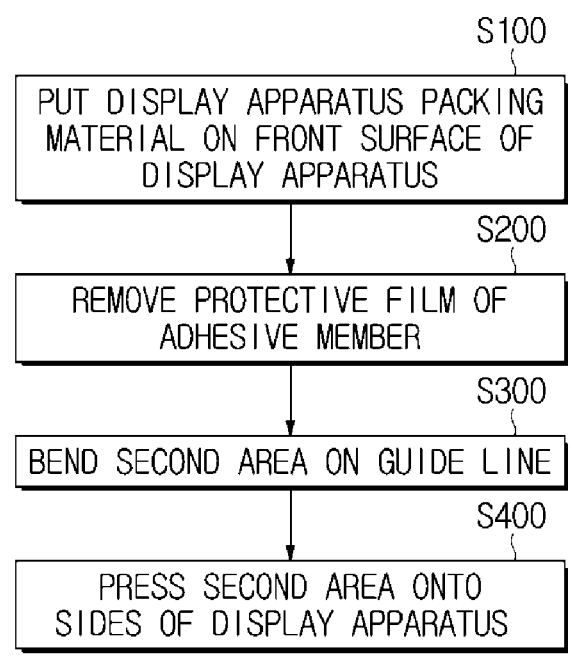
FIG. 9 is a flow chart illustrating a method of packaging a display apparatus according to an exemplary embodiment.

FIG. 9 is a flowchart illustrating a method of packing a display apparatus with a display apparatus packing material according to an exemplary embodiment. In operation S100, the display apparatus packing material 1 may be put on the front surface of the display apparatus 100.

In operation S200, the protective film 31 of the adhesive member 30 may be removed.

In operation S300, the second area 3 may be bent along the guide line 14.

In operation S400, the second area 3 is pressed onto the sides 120 of the display apparatus 100.

Accordingly, the display apparatus packing material 1 according to an exemplary embodiment can protect the display panel 110, preventing the display panel 110 from being separated from the bezel, and protecting the sides 120 of the display apparatus 100. Since the display apparatus 100 can be packed with only the display apparatus packing material 1 and no additional packing process is required, the packing efficiency of the display apparatus 100 can be improved.

Hereinafter, a display apparatus packing material 1' according to another exemplary embodiment will be described. Other components of the display apparatus packing material 1' except for components which will be described below are the same as the corresponding ones of the display apparatus packing material 1 according to the exemplary embodiments described above, descriptions about the same components will be omitted.

Figure 10:
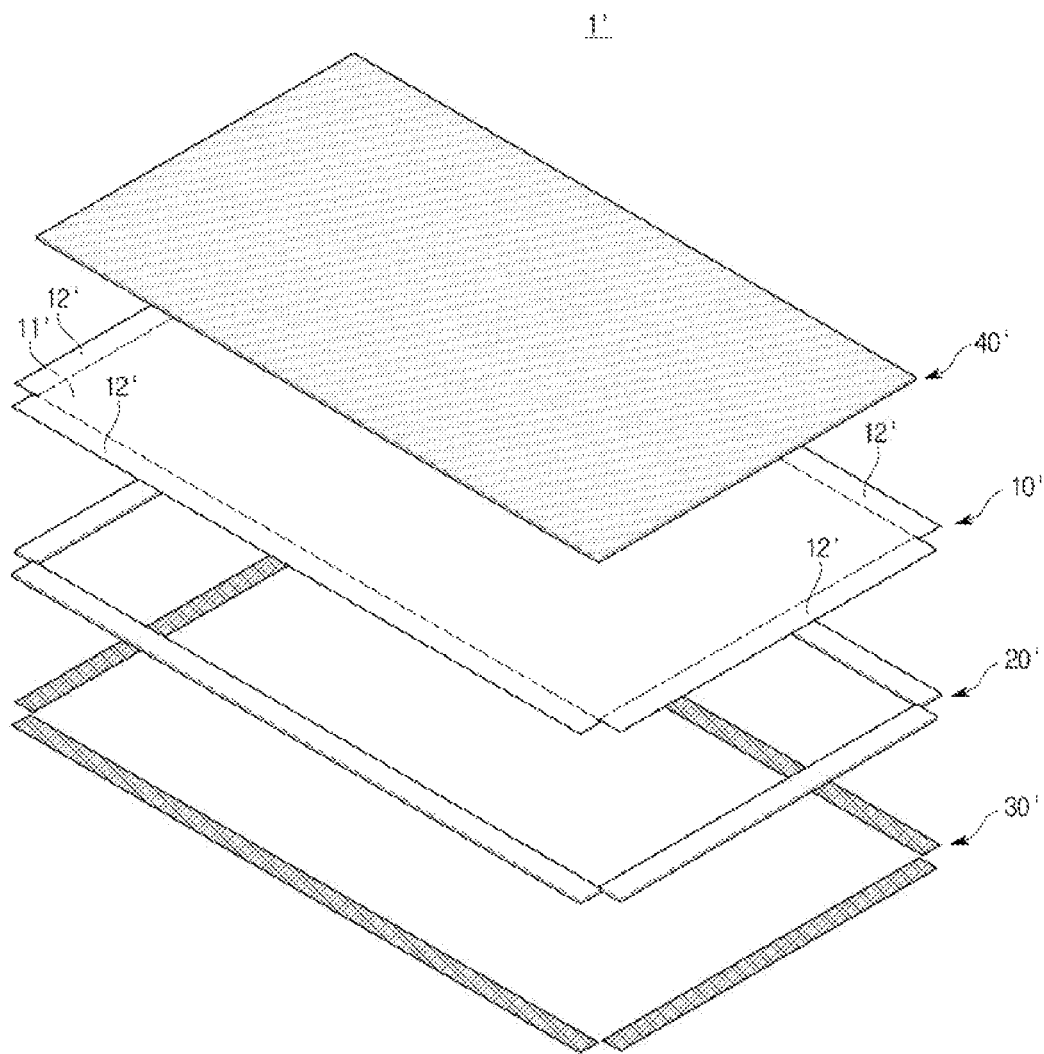
FIG. 10 is an exploded perspective view of a display apparatus packaging material according to an exemplary embodiment.
Figure 11:
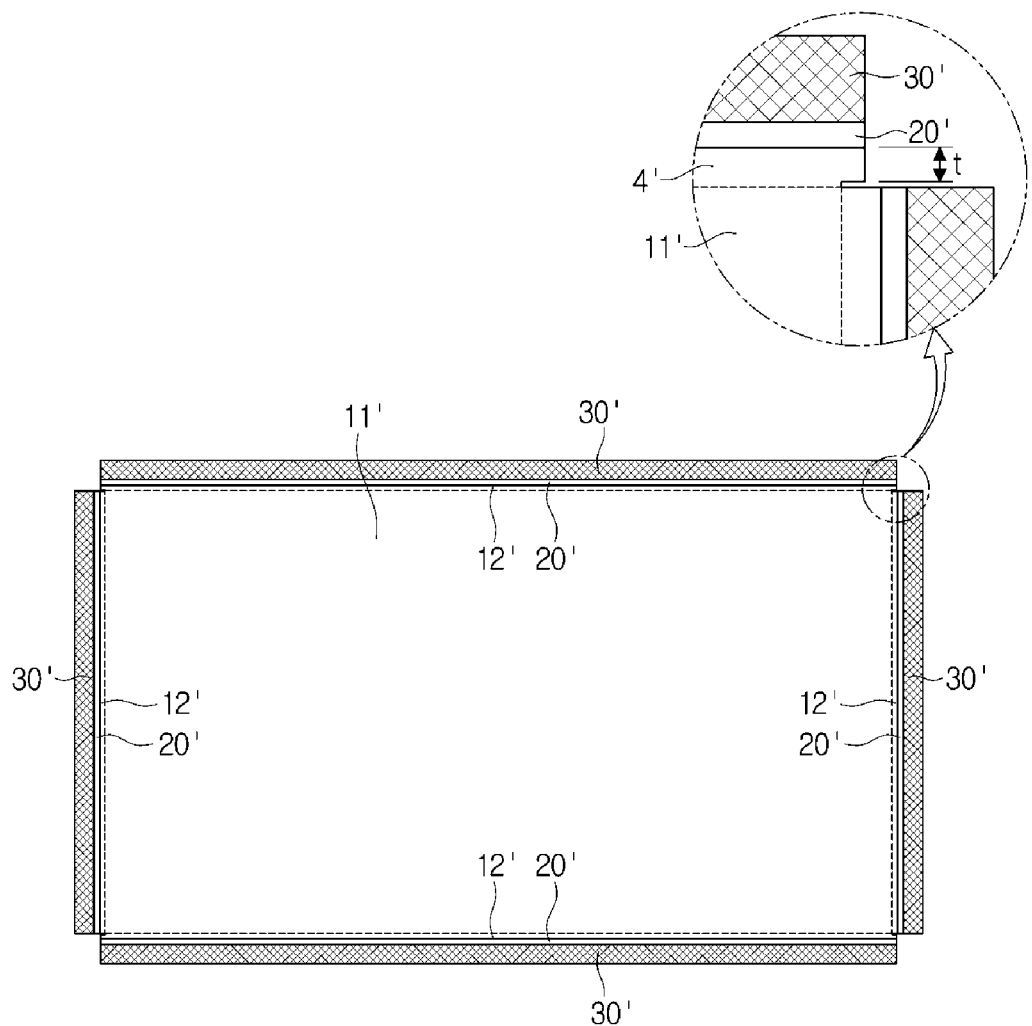
FIG. 11 is a rear view of a display apparatus packaging material according to an exemplary embodiment.

FIG. 10 is an exploded perspective view of a display apparatus packing material 1' according to an exemplary embodiment. FIG. 11 is a rear view of the display apparatus packing material according to an exemplary embodiment.

As shown in FIGS. 10 and 11, a buffer member 20' may be disposed on a rear surface of a wing portion 12' of a protective sheet 10'. The buffer member 20' may be disposed on the rear surface of the wing portion 12', and an adhesive member 30' may be disposed on a rear surface of the buffer member 20'.

A front surface of the buffer member 20' may be attached on the rear surface of the wing portion 12' by a double-sided tape or an adhesive, and the adhesive member 30' may be attached on the rear surface of the buffer member 20'.

Accordingly, on the front surface of the protective sheet 10', only an auxiliary buffer member 40' may be disposed on the front surface of a front portion 11', and all the other components except for the auxiliary buffer member 40' may be disposed behind the protective sheet 10'.

Since the buffer member 20' is disposed on the rear surface of the wing portion 12', the wing portion 12' may be disposed at the outermost areas of the sides of the display apparatus 1 when the display apparatus 100 is packed. Accordingly, when the wing portion 12' is bent, the wing portion 12' may be bent to a third area 4' so that the sides of the buffer member 20' can be disposed vertically to the front surface of the display apparatus 100.

Accordingly, the third area 4' may be larger than the third area 4 according to the exemplary embodiment of FIG. 5. Preferably, the third area 4' may be wider than the third area 4 of FIG. 5 by a thickness t of the buffer member 20'.

As described above, the packing material according to an exemplary embodiment can protect the display panel, prevent the display panel from being separated from the bezel, and include a buffer member for absorbing an impact applied to the sides of the display apparatus, thereby integrating, when packing the display apparatus, a process of packing with a member for protecting the display panel, a process for preventing the display panel from being separated from the bezel, and a process for packing with a buffer member into one process.

Although a few embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. A display apparatus packing material comprising:
a first area configured to cover a front surface of a display apparatus;
a second area configured to cover four sides of the display apparatus, and extending from edges of the first area; and
a third area disposed between the first area and the second area such that the second area is bendable with respect to the first area,
wherein the second area covers sides of the display apparatus and fixed on the sides of the display apparatus when the second area is bent,
wherein the first area includes a protective sheet that is configured to protect the front surface of the display apparatus and extends to the second area,
wherein the second area includes a buffer member configured to protect the sides of the display apparatus and an adhesive member configured to be attached on the sides of the display apparatus,
wherein the protective sheet includes the adhesive member disposed on one surface of the protective sheet and the buffer member disposed on an opposite surface of the protective sheet,
wherein the protective sheet includes a front portion located in the first area and covering the front surface of the display apparatus, and a wing portion located in the second area and extending from four edges of the front portion to cover the sides of the display apparatus,
wherein the protective sheet includes the adhesive member disposed on one surface of the wing portion of the protective sheet such that the adhesive member is configured to be attached on the sides of the display apparatus when the wing portion is bent with respect to the front portion, and
wherein the buffer member includes ethylene-vinyl acetate copolymer (EVA).

2. The display apparatus packing material according to claim 1, wherein the first area further includes an auxiliary buffer member configured to protect the front surface of the display apparatus.

3. The display apparatus packing material according to claim 2, wherein the auxiliary buffer member and the buffer member has a same thickness.

4. The display apparatus packing material according to claim 2, wherein the auxiliary buffer member includes expanded polyethylene (EPE).

5. The display apparatus packing material according to claim 2, wherein the auxiliary buffer member is formed of a material that is different from ethylene-vinyl acetate copolymer (EVA).

6. The display apparatus packing material according to claim 1, wherein the third area includes a guide line formed with a plurality of grooves arranged at intervals, and
wherein the third area is bendable along the guide line.

7. The display apparatus packing material according to claim 1, wherein the protective sheet includes a guide line forming a border between the front portion and the wing portion with a plurality of guide grooves.

8. The display apparatus packing material according to claim 1, wherein the buffer member and the adhesive member are disposed on an opposite surface of the wing portion.

9. The display apparatus packing material according to claim 1, wherein the front portion has a shape of a rectangle, and the wing portion includes four wings extending from of the front portion, and
wherein the four wings do not contact each other.

10. The display apparatus packing material according to claim 1, wherein the protective sheet includes Polyethylene phthalate (PET).

* * * * *